United States Patent
Chen et al.

(10) Patent No.: US 10,466,299 B2
(45) Date of Patent: Nov. 5, 2019

(54) ELECTRONIC TEST APPARATUS

(71) Applicant: WINWAY TECHNOLOGY CO., LTD., Kaohsiung (TW)

(72) Inventors: Kuan-Chung Chen, Kaohsiung (TW); Cheng-Hui Lin, Kaohsiung (TW); Chia-Pin Sun, Kaohsiung (TW)

(73) Assignee: WINWAY TECHNOLOGY CO., LTD., Kaohsiung (TW)

( * ) Notice: Subject to any disclaimer, the term of this patent is extended or adjusted under 35 U.S.C. 154(b) by 0 days.

(21) Appl. No.: 15/862,172

(22) Filed: Jan. 4, 2018

(65) Prior Publication Data

US 2019/0204379 A1    Jul. 4, 2019

(51) Int. Cl.
| | |
|---|---|
| G01R 31/28 | (2006.01) |
| G01R 1/067 | (2006.01) |
| G01R 31/319 | (2006.01) |
| G01R 1/073 | (2006.01) |
| G01R 1/04 | (2006.01) |

(52) U.S. Cl.
CPC ....... *G01R 31/2887* (2013.01); *G01R 1/0408* (2013.01); *G01R 1/06705* (2013.01); *G01R 1/073* (2013.01); *G01R 31/31903* (2013.01)

(58) Field of Classification Search
CPC ......... G01N 1/00; G01N 2201/00; G01R 1/00
See application file for complete search history.

(56) References Cited

U.S. PATENT DOCUMENTS

| | | | | |
|---|---|---|---|---|
| 6,888,363 B1* | 5/2005 | Bolde | ............... | G01R 31/2891 324/750.08 |
| 2005/0237073 A1* | 10/2005 | Miller | ............... | G01R 1/07385 324/756.03 |
| 2010/0254426 A1* | 10/2010 | Okamoto | ................. | G01K 1/14 374/141 |
| 2010/0264949 A1* | 10/2010 | Hobbs | ............... | G01R 31/2889 324/750.05 |
| 2012/0194207 A1* | 8/2012 | Vaganov | ................. | G01L 5/162 324/750.01 |
| 2017/0139002 A1* | 5/2017 | Okada | ................. | G01R 1/0408 |

* cited by examiner

*Primary Examiner* — Huy Q Phan
*Assistant Examiner* — Temilade S Rhodes-Vivour
(74) *Attorney, Agent, or Firm* — Muncy, Geissler, Olds & Lowe, P.C.

(57) ABSTRACT

An electronic test apparatus is adapted for testing an electronic component which includes a circuit substrate and a plurality of contact electrodes disposed on the circuit substrate. The electronic test apparatus includes a test seat and a plurality of spring probes. The test seat includes a metallic main body that has a first side adapted to be in contact with the circuit substrate and a second side opposite to the first side, and that is formed with a plurality of spaced-apart probe holes extending through the first and second sides, and a temperature sensor disposed in the metallic main body. The spring probes are adapted to be electrically connected to the contact electrodes and each is positioned in a respective one of the probe holes.

12 Claims, 9 Drawing Sheets

ELECTRONIC TEST APPARATUS

FIELD

The disclosure relates to an electronic test apparatus, and more particularly to an electronic test apparatus adapted for testing an electronic component and including a temperature sensor.

BACKGROUND

Referring to FIG. 1, a conventional electronic test apparatus 1 used for testing an electronic component 10 for examining performances thereof is illustrated. The electronic apparatus 1 includes a test seat 11 for supporting the electronic component 10 thereon, and a test socket 12 configured to be conjugated to the test seat 11 for testing the electronic component 10. When the electronic component 10 is disposed between and electrically connected to the test seat 11 and the test socket 12, the performance of the electronic component 10 can be evaluated by detecting and analyzing signals that are transmitted through the electronic component 10.

Further referring to FIG. 2, since the electronic component 10 has a working temperature that is higher than a room temperature during operation, a reliability performance test for the electronic component 10, such as a temperature operating life test, has to be applied to the electronic component 10 that is heated to the relatively high working temperature. However, when the electronic component 10 is clamped between the seat base 11 and the test socket 12 of the conventional electronic test apparatus 1, the electronic component 10 cannot be directly heated by an external heating device 2. To solve the above-mentioned problem, the electronic component 10 has to be first heated by the external heating device 2 to a predetermined temperature and then be transferred to the conventional electronic test apparatus 1. However, during the transfer of the electronic component 10, the predetermined temperature is hardly maintained and may be changed, which may lead to inaccurate and unreliable test results.

SUMMARY

Therefore, an object of the disclosure is to provide an electronic test apparatus that can alleviate at least one of the drawbacks of the prior art.

According to the disclosure, an electronic test apparatus is adapted for testing an electronic component that includes a circuit substrate, and a plurality of contact electrodes respectively disposed on the circuit substrate. The electronic test apparatus includes a test seat and a plurality of spring probes.

The test seat includes a metallic main body that has a first side adapted to be in contact with the circuit substrate of the electronic component and a second side opposite to the first side, and that is formed with a plurality of spaced-apart probe holes extending through the first and second sides, and a temperature sensor disposed in the metallic main body.

The spring probes are adapted to be electrically connected to the contact electrodes of the electronic component. Each of the spring probes is positioned in a respective one of the probe holes of the test seat.

BRIEF DESCRIPTION OF THE DRAWINGS

Other features and advantages of the disclosure will become apparent in the following detailed description of the embodiment with reference to the accompanying drawings, of which.

DETAILED DESCRIPTION

Figure 1:
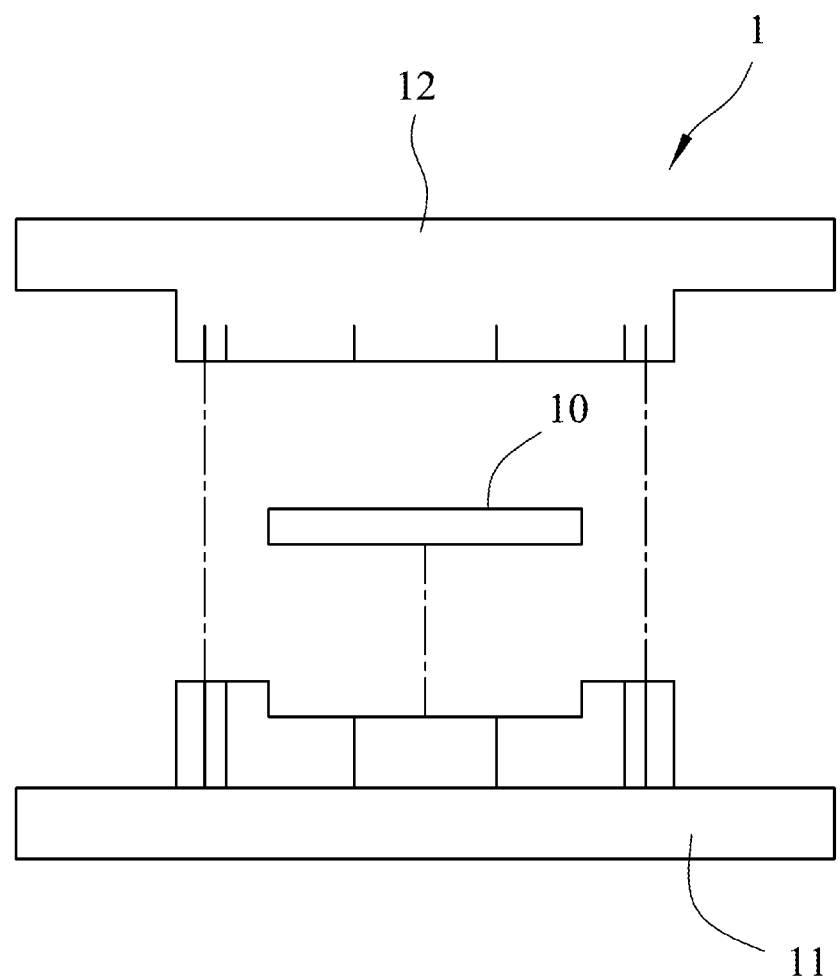
FIG. 1 is a schematic view illustrating a conventional electronic test apparatus for testing an electronic component.
Figure 2:
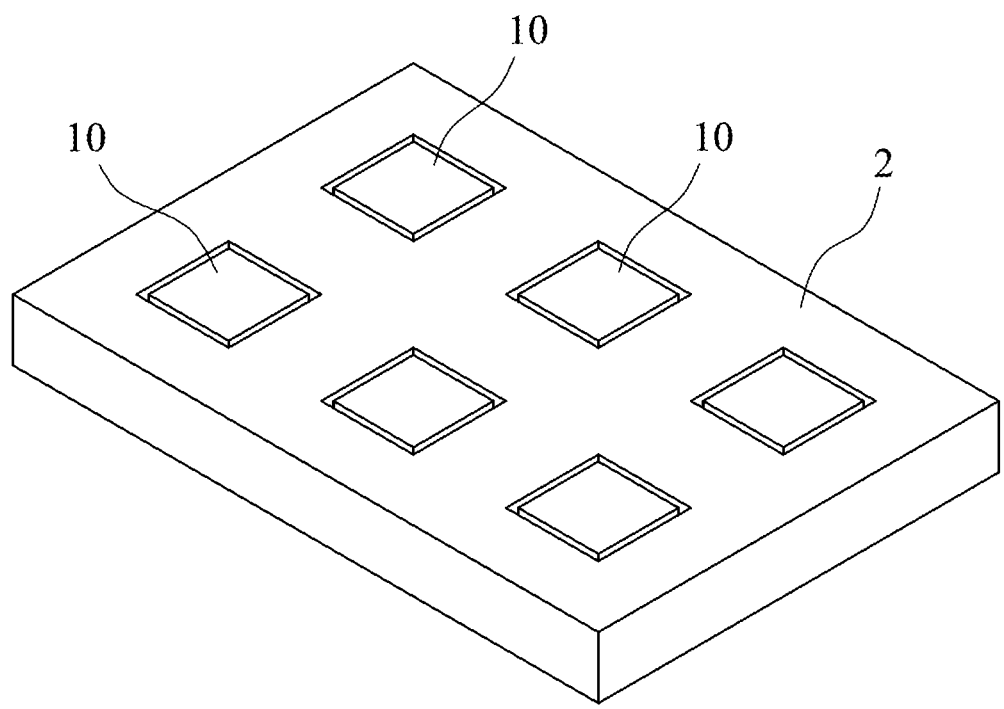
FIG. 2 is a perspective view illustrating a conventional heating device for heating the electronic component.
Figure 3:
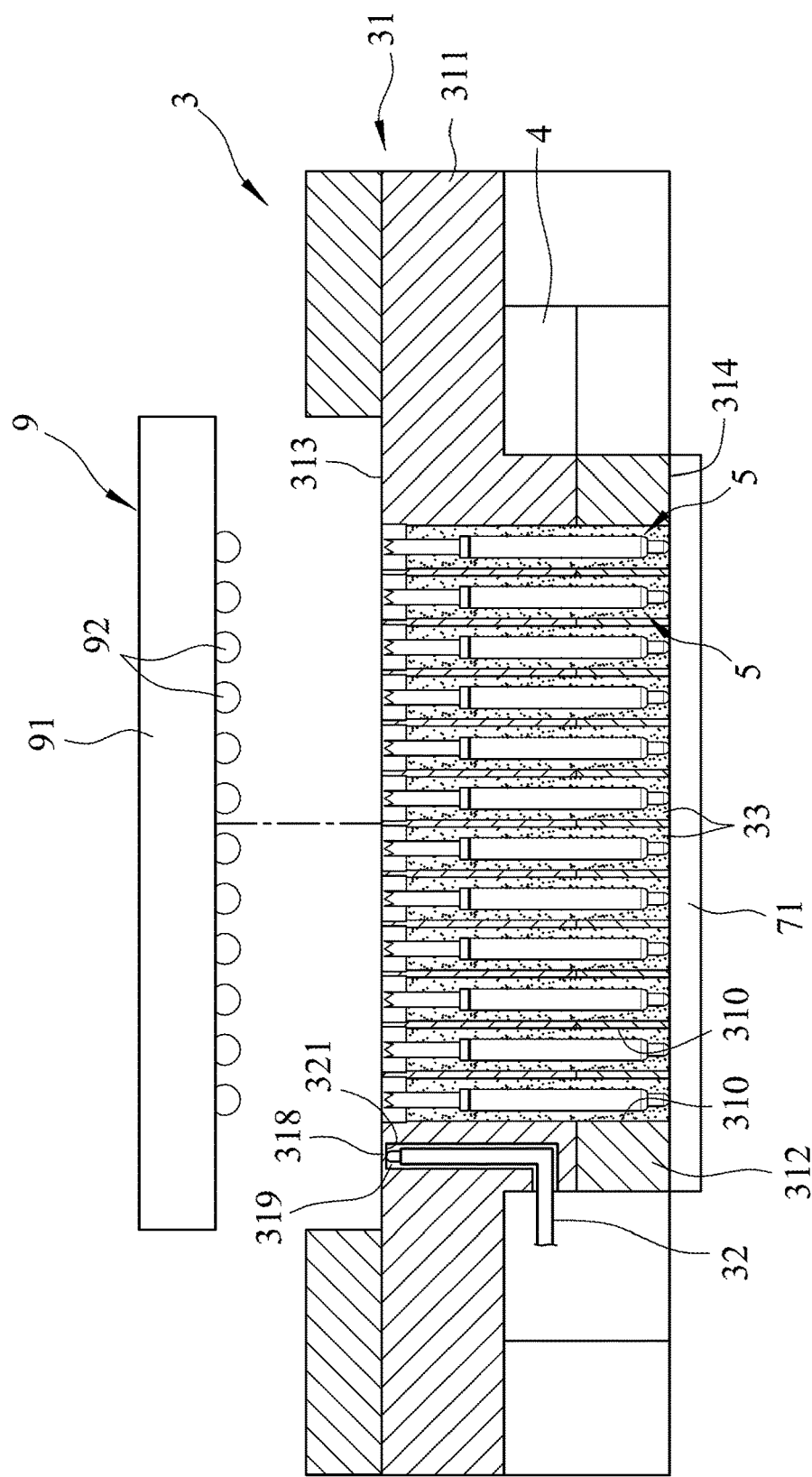
FIG. 3 is a schematic cross-sectional view illustrating an embodiment of an electronic test apparatus according to the disclosure and an electronic component to be tested.
Figure 4:
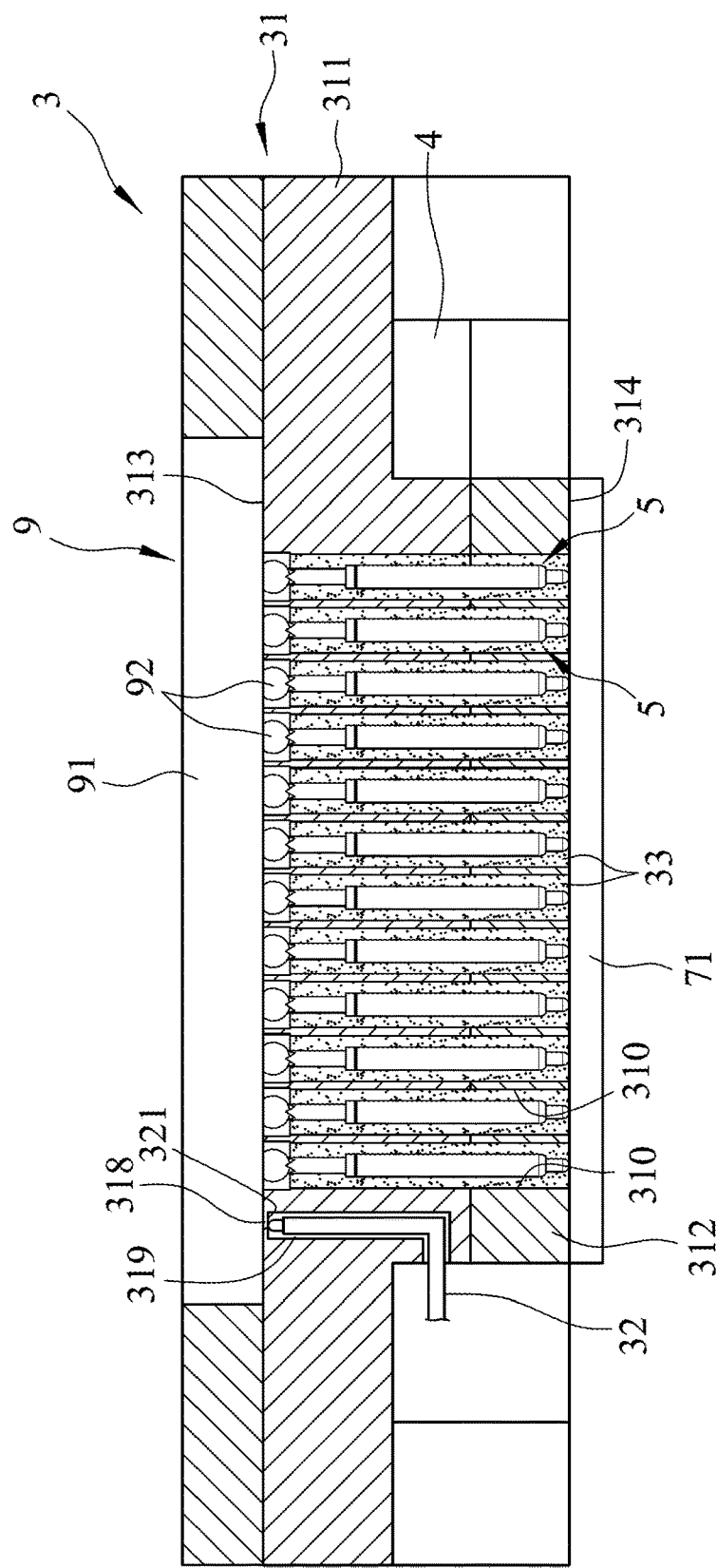
FIG. 4 is a schematic cross-sectional view illustrating a test seat of the electronic test apparatus that is in contact with the electronic component.
Figure 5:
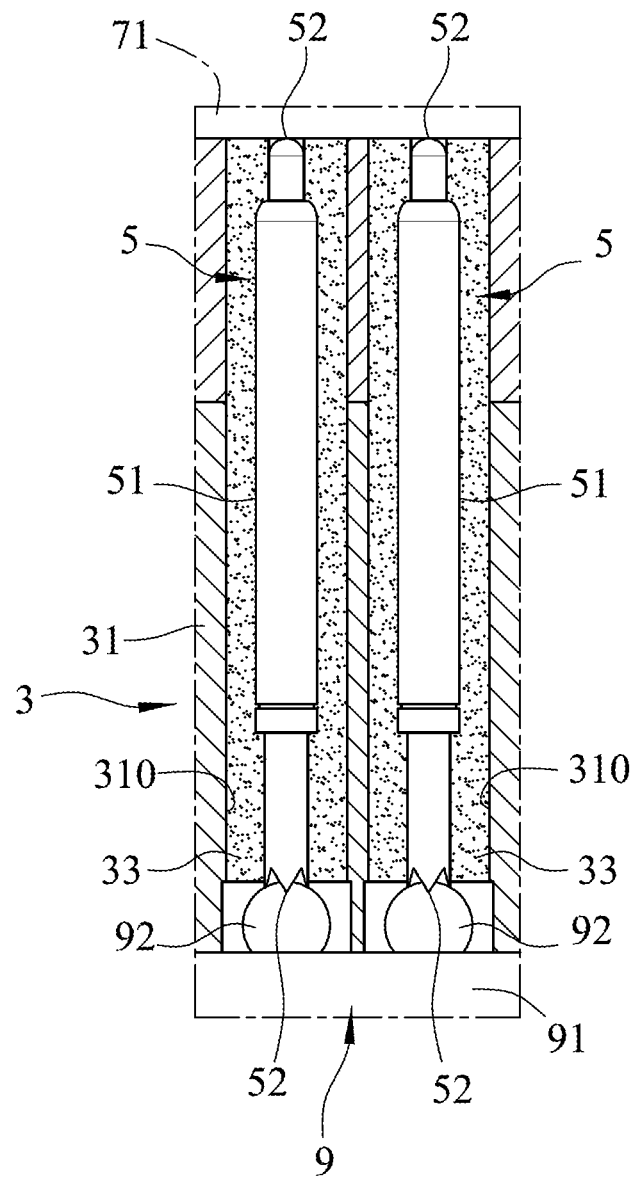
FIG. 5 is a partially enlarged view of FIG. 4 illustrating the test seat and a plurality of spring probes.

Referring to FIGS. 3 to 5, an embodiment of an electronic test apparatus according to the disclosure is adapted for testing an electronic component 9. The electronic component 9 includes a circuit substrate 91, and a plurality of contact electrodes 92 that are respectively disposed on the circuit substrate 91.

The embodiment of an electronic test apparatus includes a test seat 3 and a plurality of spring probes 5. The test seat 3 includes a metallic main body 31, a temperature sensor 32, and a plurality of insulation fillers 33.

The metallic main body 31 has a first side 313 adapted to be in contact with the circuit substrate 91 of the electronic component 9 and a second side 314 opposite to the first side 313, and is formed with a plurality of spaced-apart probe holes 310 extending through the first and second sides 313, 314. The temperature sensor 32 is disposed in the metallic main body 31.

The spring probes 5 are adapted to be electrically connected to the contact electrodes 92 of the electronic component 9. Each of the spring probes 5 is positioned in a respective one of the probe holes 310 of the test seat 3. When testing of the electronic component 9 is carried out, the spring probes 5 are electrically connected to a test substrate 71 and to the contact electrodes 92 of the electronic component 9, and functional performance of the electronic component 9 will be evaluated by the electronic test apparatus through the transfer of electric signals.

In the embodiment, the electronic test apparatus further includes a temperature-adjustment unit 4 that is disposed on the test seat 3.

The circuit substrate 91 of the electronic component 9 is directly in contact with the test seat 3. Each of the insulation fillers 33 is disposed inside of a respective one of the probe holes 310 to position a respective one of the spring probes 5. The metallic main body 31 of the test seat 3 is further formed with a sensor hole 319 that is spaced apart from the probe holes 310 and that receives the temperature sensor 32. Specifically, the metallic main body 31 further includes an upper part 311 and a lower part 312 that is connected to the upper part 311. The temperature sensor 32 is disposed in the upper part 311. The probe holes 310 extend through the upper and lower parts 311, 312. The probe holes 310 have a uniform cross-sectional dimension. Therefore, impedance matching of the spring probes 5 positioned by the insulation fillers 33 in the probe holes 310 can be respectively adjusted.

The temperature-adjustment unit 4 is configured to conduct temperature adjustment of the test seat 3 through heat transfer between the test seat 3 and the electronic component 9. In the embodiment, the temperature-adjustment unit 4 is a heater for heating the test seat 3 so that the test seat 3 is able to transfer heat to the electronic component 9. The sensor hole 319 has one end 321 proximal to the first side 313 of the metallic main body 31. The metallic main body 31 further includes a partition member 318 disposed at the one end 321 of the sensor hole 319 so that the temperature sensor 32 detects the temperature of the electronic component 9 in a manner of indirect contact with the electronic component 9.

Each of the spring probes 5 has two opposite end faces 52 and a peripheral surface 51 that extends between the opposite end faces 52. Each of the insulation fillers 33 surrounds entirely the peripheral surface 51 of a respective one of the spring probes 5, and does not cover the opposite end faces 52 of the respective one of the spring probes 5.

During the operation of the electronic test apparatus according to the disclosure, the test seat 3 is moved toward the electronic component 9 until the metallic main body 31 is in contact with the contact electrodes 92, and each of the spring probes 5 is indented relative to the first side 313 of the metallic main body 31. Therefore, each of the spring probes 5 and a respective one of the contact electrodes 92 do not extend out of a respective one of the probe holes 310.

Since the metallic main body 31 of the test seat 3 is made of a metal material, the heat generated by the heater 4 can be transferred to the electronic component 9 through the metallic main body 31. Before conducting the test of the electronic component 9, the electronic component 9 is first heated to a predetermined temperature by the heater 4, and during testing of the electronic component 9, the temperature sensor 32 is able to detect a real-time temperature by heat transfer through the partition member 318. A user can conduct real-time control of the temperature-adjusting unit 4 in accordance with the real-time temperature obtained from the temperature sensor 32 in comparison with the predetermined temperature, thereby facilitating the maintenance of the predetermined temperature of the electronic component 9. Therefore, the accuracy and reliability of the test results of the electronic component 9 can be enhanced.

Alternatively, the temperature-adjustment unit 4 may be a cooler for maintaining the electronic component 9 at a predetermined temperature that is lower than room temperature.

Figure 6:
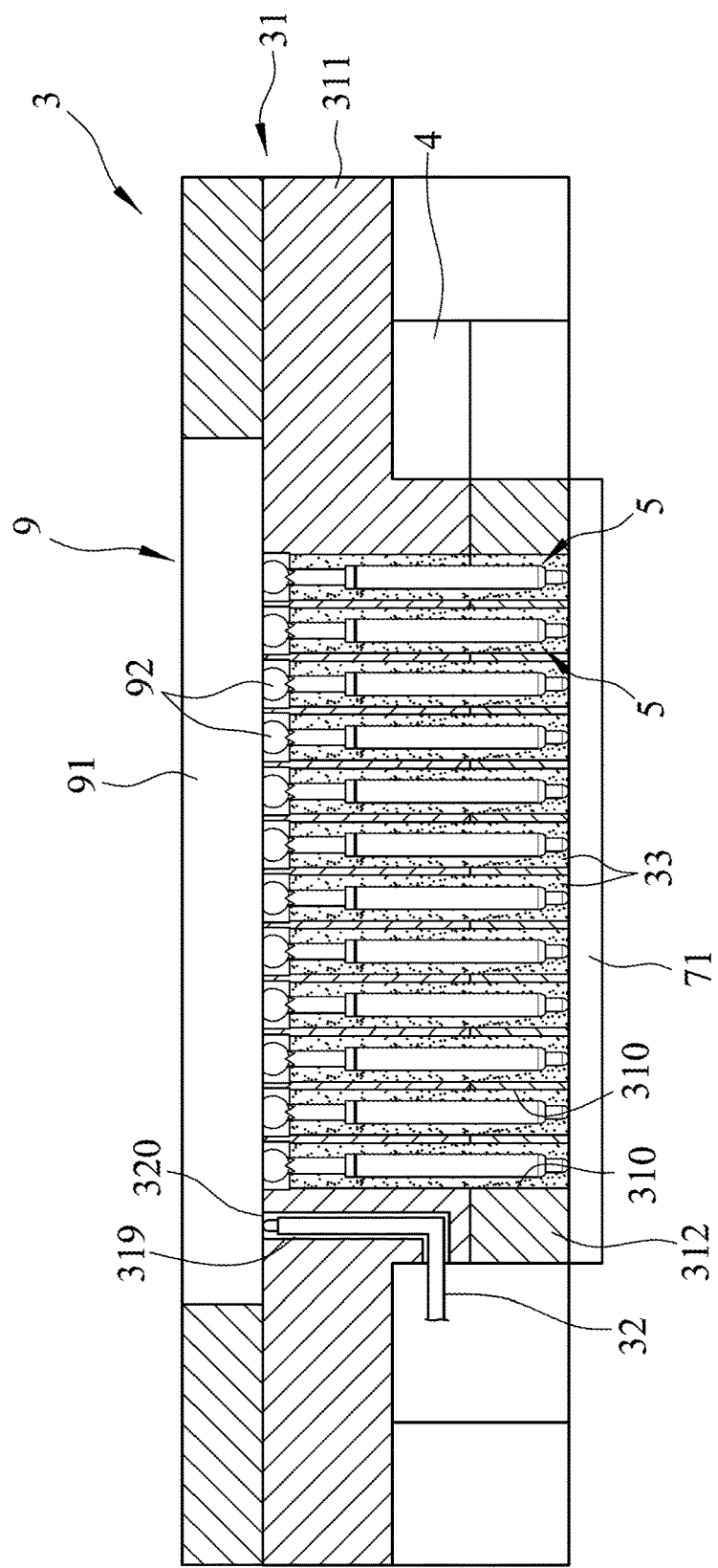
FIG. 6 is a schematic cross-sectional view illustrating another configuration of the embodiment.

Referring to FIG. 6, another configuration of the embodiment of the electronic test apparatus is illustrated. The sensor hole 319 extends toward the first side 313 of the metallic main body 31 of the test seat 3 and has an open end 320 that is open at the first side 313. The temperature sensor 32 is extendable through the open end 320 for direct contact with the electronic component 9. The temperature of the electronic component 9 can be measured directly by the temperature sensor 32.

Figure 7:
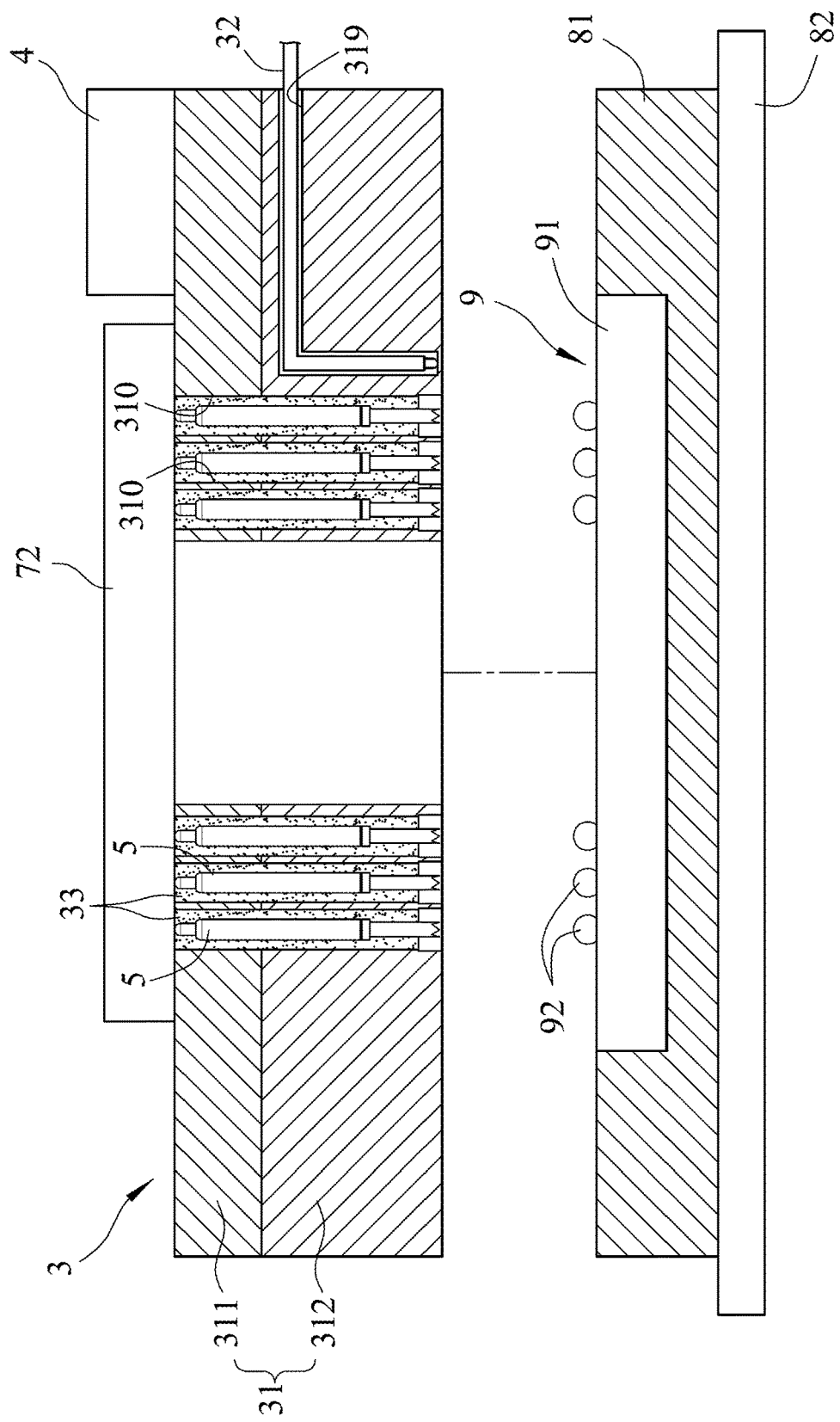
FIG. 7 is a schematic cross-sectional view illustrating still another configuration of the embodiment.
Figure 8:
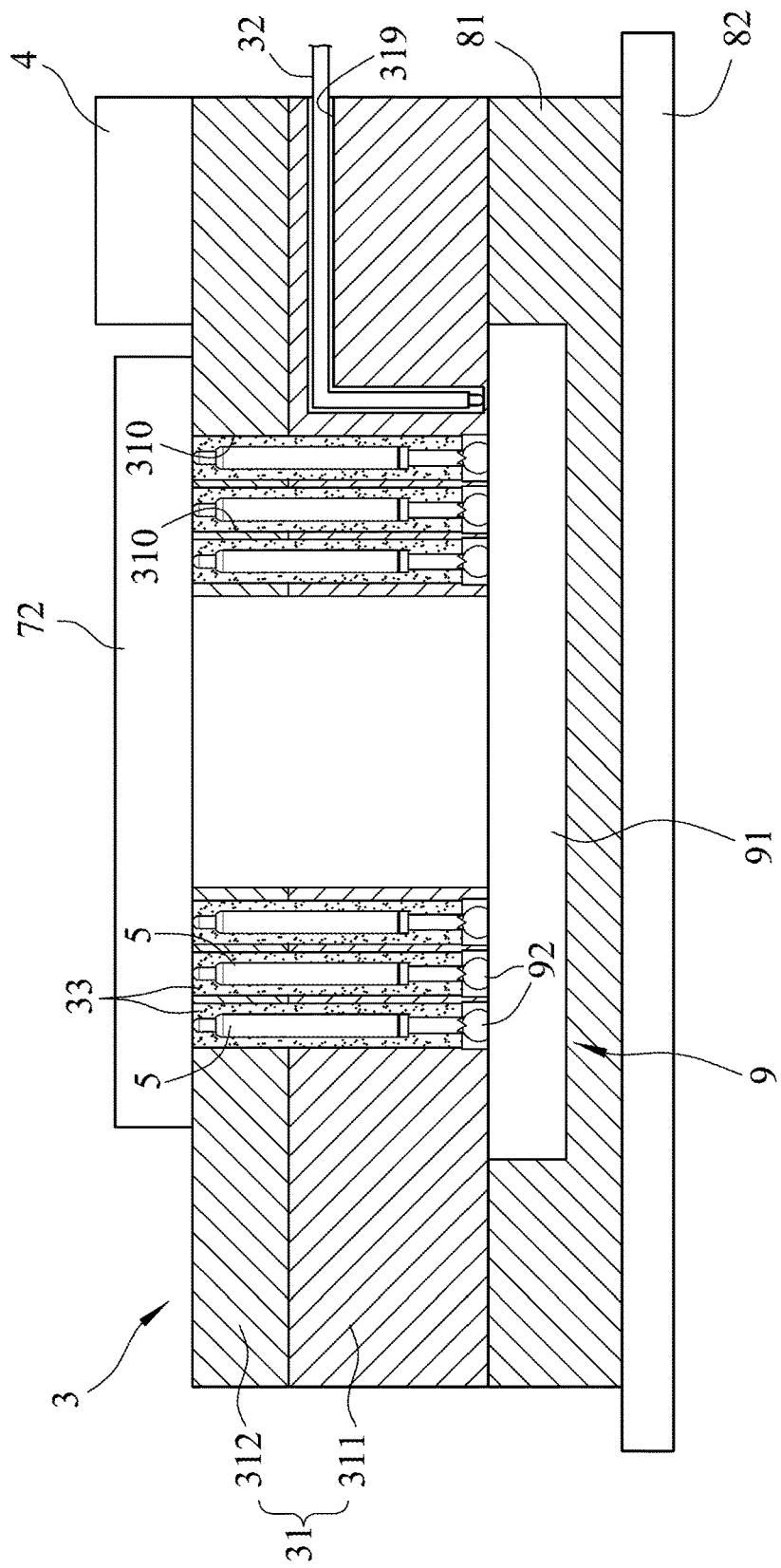
FIG. 8 is a schematic cross-sectional view illustrating testing of the electronic component with the configuration of the embodiment of FIG. 7.

Referring to FIGS. 7 and 8, still another configuration of the embodiment of the electronic test apparatus is illustrated. The electronic test apparatus is adapted for testing the electronic component 9 that is packaged with a package-on-package (POP) method. The electronic test apparatus may be operated in corporation with an auxiliary test plate 72 that is disposed on the lower part 312 of the metallic main body 31, a socket 81 that is configured to connect the test seat 3, and a driving circuit substrate 82 that is electrically connected to the socket 81. When the electronic component 9 is plugged into and supported by the socket 81 with the test seat 3 connected to the socket 81, the contact electrodes 92 of the electronic component 9 will be electrically connected to the spring probes 5 in the probe holes 310 of the test seat 3. Thus, the driving circuit substrate 82, the spring probes 5 and the electronic component 9 are signally connected to each other, and the electronic test apparatus is driven by the driving circuit substrate 82 to perform the test. Alternatively, the electronic component 9 may be first connected to the test seat 3, and then the test seat 3 and the electronic component 9 are incorporated together with the socket 81.

Figure 9:
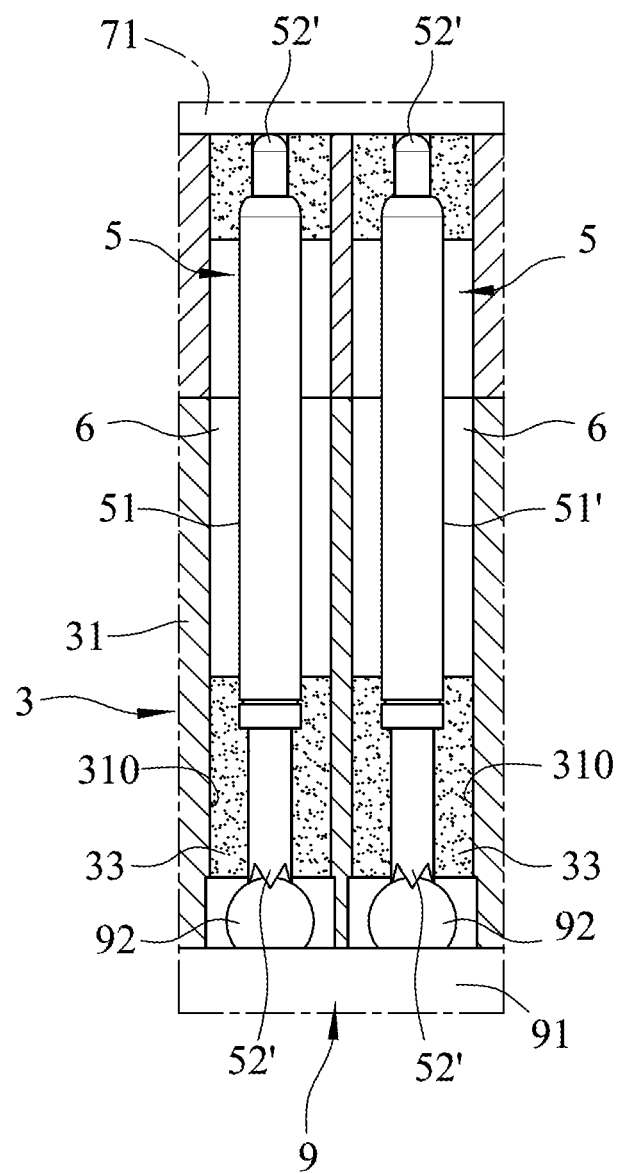
FIG. 9 is a fragmentary cross-sectional view illustrating yet another configuration of the embodiment.

Referring to FIG. 9, yet another configuration of the embodiment of the electronic test apparatus is illustrated. Each of the spring probes 5 has two opposite end portions 52' and a peripheral surface 51' extending between the opposite end portions 52'. The peripheral surface 51' of each of the spring probes 5 is partially surrounded by a respective one of the insulation fillers 33 such that an air gap 6 is formed within a respective one of the probe holes 310 around a respective one of the spring probes 5. Therefore, the impedance matching of each of the spring probes 5 can be further adjusted by changing the dimension of the respective one of the air gaps 6 to improve the accuracy and reliability of the test results.

To sum up, by virtue of the arrangement of the metallic main body 31, the temperature-adjustment unit 4 and the temperature sensor 32, the temperature of the electronic component 9 can be adjusted in real-time to be maintained at the predetermined temperature during the test. Therefore, the accuracy and reliability of the test results of the electronic test apparatus can be enhanced.

In the description above, for the purposes of explanation, numerous specific details have been set forth in order to provide a thorough understanding of the embodiment. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects.

While the disclosure has been described in connection with what is considered the exemplary embodiment, it is understood that this disclosure is not limited to the disclosed embodiment but is intended to cover various arrangements included within the spirit and scope of the broadest interpretation so as to encompass all such modifications and equivalent arrangements.

What is claimed is:

1. An electronic test apparatus for testing an electronic component, the electronic component including a circuit substrate, and a plurality of contact electrodes respectively disposed on the circuit substrate, said electronic test apparatus comprising:

a test seat including a metallic main body that has a first side adapted to be in contact with the circuit substrate of the electronic component and a second side opposite to said first side, and that is formed with a plurality of spaced-apart probe holes extending through said first and second sides, and a temperature sensor disposed in said metallic main body;

a plurality of spring probes adapted to be electrically connected to the contact electrodes of the electronic component, each of said spring probes being positioned in a respective one of said probe holes of said test seat; and a temperature-adjustment unit disposed on said test seat for conducting temperature adjustment of said test seat through heat transfer between said test seat and the electronic component.

2. The electronic test apparatus of claim 1, wherein said temperature-adjustment unit is a heater for heating said test seat so that said test seat is able to transfer heat to the electronic component.

3. The electronic test apparatus of claim 1, wherein said metallic main body of said test seat is further formed with a sensor hole spaced apart from said probe holes and receiving said temperature sensor.

4. The electronic test apparatus of claim 3, wherein said sensor hole extends toward said first side of said metallic main body of said test seat and has an open end that is open at said first side, and said temperature sensor is extendable through said open end for direct contact with the electronic component.

5. The electronic test apparatus of claim 3, wherein said sensor hole has one end proximal to said first side of said metallic main body, said metallic main body further including a partition member disposed at said one end of said sensor hole so that said temperature sensor detects the temperature of the electronic component in a manner of indirect contact with the electronic component.

6. The electronic test apparatus of claim 1, wherein said probe holes have a uniform cross-sectional dimension.

7. The electronic test apparatus of claim 1, wherein each of said spring probes is indented relative to said first side of said metallic main body so that each of said spring probes and a respective one of the contact electrodes do not extend out of a respective one of said probe holes when said metallic main body is in contact with the contact electrodes of the electronic component.

8. The electronic test apparatus of claim 1, wherein said test seat further includes a plurality of insulation fillers, each of which is disposed inside of a respective one of said probe holes to position a respective one of said spring probes.

9. The electronic test apparatus of claim 8, wherein each of said spring probes has two opposite end faces and a peripheral surface extending between said opposite end faces, each of said insulation fillers surrounding entirely said peripheral surface of a respective one of said spring probes, and not covering said opposite end faces of said respective one of said spring probes.

10. The electronic test apparatus of claim 8, wherein each of said spring probes has two opposite end portions and a peripheral surface extending between said end portions, said peripheral surface of each of said spring probes being partially surrounded by a respective one of said insulation fillers such that an air gap is formed within a respective one of said probe holes around a respective one of said spring probes.

11. The electronic test apparatus of claim 1, wherein said metallic main body of said test seat includes an upper part and a lower part connected to said upper part, said probe holes extending through said upper and lower parts.

12. The electronic test apparatus of claim 11, wherein said temperature sensor is disposed in said upper part, said temperature-adjustment unit being mounted to said upper part.

* * * * *